(12) United States Patent
Yang

(10) Patent No.: US 9,417,958 B2
(45) Date of Patent: Aug. 16, 2016

(54) FLASH MEMORY CONTROL METHOD, CONTROLLER AND ELECTRONIC APPARATUS

(71) Applicant: Silicon Motion Inc., Hsinchu (TW)

(72) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 13 days.

(21) Appl. No.: 13/911,096

(22) Filed: Jun. 6, 2013

(65) Prior Publication Data

US 2013/0329492 A1    Dec. 12, 2013

Related U.S. Application Data

(60) Provisional application No. 61/656,017, filed on Jun. 6, 2012.

(30) Foreign Application Priority Data

May 16, 2013   (TW) .............................. 102117418 A

(51) Int. Cl.

| | |
|---|---|
| *G11C 11/34* | (2006.01) |
| *G11C 16/06* | (2006.01) |
| *G06F 11/10* | (2006.01) |
| *G11C 16/10* | (2006.01) |
| *G11C 16/26* | (2006.01) |
| *G11C 11/56* | (2006.01) |
| *G11C 29/52* | (2006.01) |
| *G11C 16/04* | (2006.01) |

(52) U.S. Cl.
CPC ........ *G06F 11/1068* (2013.01); *G06F 11/1048* (2013.01); *G06F 11/1072* (2013.01); *G11C 11/5628* (2013.01); *G11C 11/5642* (2013.01); *G11C 16/10* (2013.01); *G11C 16/26* (2013.01); *G11C 29/52* (2013.01); *G11C 16/0483* (2013.01); *G11C 2211/5641* (2013.01)

(58) Field of Classification Search
None
See application file for complete search history.

(56) References Cited

U.S. PATENT DOCUMENTS

| | | |
|---|---|---|
| 7,080,278 B1 | 7/2006 | Kleiman |
| 7,440,338 B2 | 10/2008 | Kuroda |
| 7,579,683 B1 | 8/2009 | Falik |
| 8,072,826 B2 | 12/2011 | Chang |

(Continued)

FOREIGN PATENT DOCUMENTS

| | | |
|---|---|---|
| CN | 102034548 A | 4/2011 |
| CN | 103827833 A | 5/2014 |
| EP | 1 581 876 B1 | 8/2010 |
| JP | 2004-30577 A | 1/2004 |

(Continued)

*Primary Examiner* — Kretelia Graham
(74) *Attorney, Agent, or Firm* — Winston Hsu; Scott Margo

(57) ABSTRACT

A memory control method is used for controlling a flash memory. The flash memory includes a first memory element and a second memory element. The second memory element includes multiple blocks and each block includes multiple pages. In this method, original data are written to the first memory element. Input data are obtained by reading the original data from the first memory element. The input data includes multiple input data rows. The input data rows are divided into data groups. Each input data row corresponding to each data row is written to a corresponding data page on the second memory element. A parity row corresponding to each data group is written to a data page on the second memory element. The number of data rows for each data group is smaller than the number of each block in the second memory element.

15 Claims, 20 Drawing Sheets

(56) References Cited

U.S. PATENT DOCUMENTS

| | | |
|---|---|---|
| 8,788,908 B2 | 7/2014 | Yoon |
| 2001/0048628 A1 | 12/2001 | Koyanagi |
| 2006/0140036 A1 | 6/2006 | Yamamoto |
| 2009/0196102 A1 | 8/2009 | Kim |
| 2009/0198877 A1* | 8/2009 | Pua et al. ............... 711/103 |
| 2012/0290897 A1* | 11/2012 | Yoon et al. ............. 714/766 |
| 2013/0024605 A1* | 1/2013 | Sharon et al. .......... 711/103 |

FOREIGN PATENT DOCUMENTS

| | | |
|---|---|---|
| KR | 100293066 B1 | 6/2001 |
| KR | 100827662 B1 | 5/2008 |
| KR | 1020120126389 A | 11/2012 |
| TW | I302318 | 10/2008 |
| TW | I317519 | 11/2009 |
| TW | I347610 | 8/2011 |
| TW | I362667 | 4/2012 |
| TW | I364761 | 5/2012 |

* cited by examiner

FLASH MEMORY CONTROL METHOD, CONTROLLER AND ELECTRONIC APPARATUS

CROSS REFERENCE TO RELATED APPLICATIONS

This application claims the benefit of U.S. provisional application No. 61/656,017, filed on Jun. 6, 2012 and incorporated herein by reference.

BACKGROUND OF THE INVENTION

1. Field of the Invention

The present invention relates to error processing apparatus of flash memory and method and more particularly relates to error processing apparatus and method of multi-levels flash memory.

2. Description of the Prior Art

Flash memory and other nonvolatile memory are developing rapidly and applied in various electronic apparatuses. No matter the size or technology of flash memory will continue to be enhanced continuously. When more and more data are stored in such nonvolatile memory, it is more and more important for providing effective and reliable error detection and error management for ensuring data correction and safety.

SUMMARY OF THE INVENTION

An embodiment according to the present invention is providing a memory control method for controlling a flash memory. The flash memory includes a first memory component and a second memory component. The second memory component includes a plurality of blocks. Each block comprises a plurality of data pages. In the memory control method, original data are firstly written to the first memory component. Besides, input data are obtained from reading the original data. The input data includes a plurality of input data rows. The plurality of input data rows are divided into a plurality of data groups. Each of the input data rows corresponding to each data group is written to one corresponding data page of the second memory component. Besides, a parity row corresponding to each data group is written to one data page of the second memory component. The number of the data rows corresponding to each data group is smaller than the number of the data pages included in each block in the second memory component.

Another embodiment is a memory controller for controlling a flash memory. The flash memory includes a first memory component and a second memory component. The second memory component includes a plurality of blocks. Each block includes a plurality of data pages. The memory controller includes a memory component writer, a reader and a second memory component writer. The first memory component writer writes row data to the first memory component. The reader reads the original data from the first memory component and generates an input data, the input data comprising a plurality of input data rows.

The second memory component writer divides the plurality of input data rows into a plurality of data groups. The corresponding input data rows of each data group are written to corresponding data pages of the second memory component. A corresponding parity row of each data group is written to a corresponding page of the second memory component. The number of the input rows for each data group is smaller than the number of the data pages for each block in the second memory component.

Another embodiment according to the present invention is an electronic apparatus, having a flash memory and a controller. The flash memory includes a first memory component and a second memory component. The second memory component includes a plurality of blocks. Each block comprises a plurality of data pages.

The memory controller is used for controlling the flash memory. The memory controller has a first memory component writer, a reader and a second memory component writer. The first memory component writer writes input data to the first memory component. The reader reads the input data from the first memory component, the input data comprising a plurality of input data row. The second memory component writer divides the plurality of input data rows into a plurality of data groups. The input data rows corresponding to each data group are written to corresponding data pages in the second memory component. The number of the input data rows of each data group is smaller than the number of the data pages of each block in the second memory component.

Another embodiment according to the present invention is a memory control method for controlling a flash memory. The flash memory comprises a memory component. The memory component includes a plurality of blocks. Each block comprises a plurality of data pages. The memory control method includes the following steps.

A data group setting is read and the data group setting indicates a number of the plurality of data rows included in a data group. Each data row stores in a corresponding data page. The number of the plurality of data rows of the data group is smaller than the number of data pages for each block. According to the data group setting, a plurality of data rows and a parity row corresponding to the data group are read from the memory component. In addition, the plurality of data rows are error detected and corrected using the parity row.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
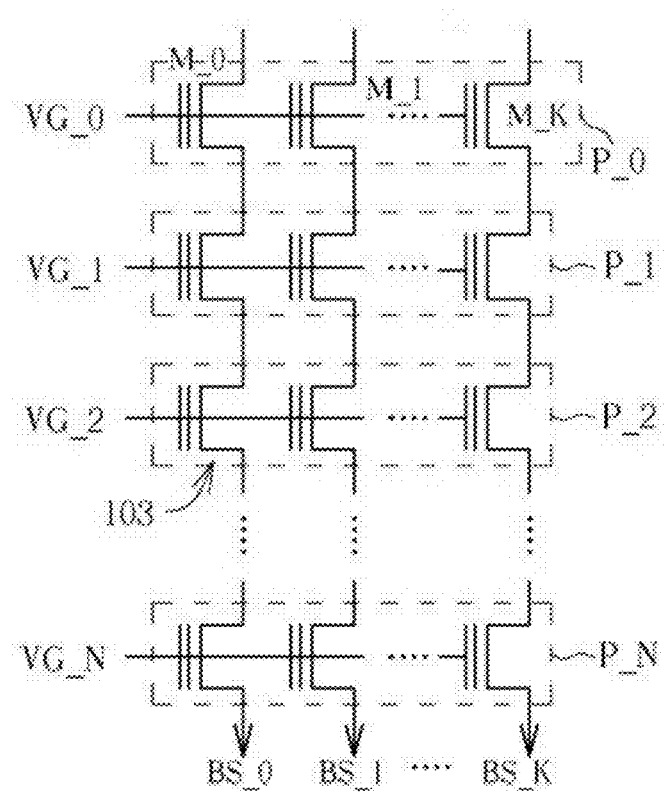
FIG. 1 illustrates a block in a memory component of a NAND structure flash memory.

The embodiment of the present invention includes a memory control method, which may be implemented by software, hardware or software combined with hardware for controlling the flash memory. In the embodiment of the memory control method, the controlled flash memory includes one or more first memory components and one or more second memory components. These memory components may be flash memory modules, e.g. as die chips being packaged together, or as integrated chips being connected with connecting lines, or being manufactured by other methods. Compared with the second memory component, the first memory component is more reliable and has lower error rate. Before the original data are written to the flash memory, the original data are written to the first memory component. Then, at proper timing, the original data are read again from the first memory component and used as input data to write into the second memory component.

The second memory component has a plurality of blocks. Each block includes a number of data pages. The input data are divided into a plurality of data groups. Each data group has a number of input data rows. The number of input data rows for each data group is smaller than the data page number for each block in the second memory component. In other words, each block may store the input data rows of a plurality of data groups in each block for the second memory component.

As mentioned above, the stability of the second memory component is not very well, each data group to be stored in the second memory component may be protected with parity generation methods like low density parity-check (LDPC), Bose-Chaudhuri-Hocquenghem (BCH) to generate parity row (or called parity row) corresponding to each data group. In addition, each input row may include parity code corresponding to the input data row.

Compared with taking the whole block as a unit, the method for adopting the data group decreases risk of interrupt during writing process because of power break or other reasons.

In addition, the number of input data rows for each data group may be set and adjusted. Furthermore, each data group may correspond to one or more parity rows. The characteristics of the second memory component may be adjusted according to the second memory component.

In addition, the data group may be configured for including different number of input data rows in different blocks. In fact, even in the same block, different data group may have different number of input data rows.

For example the first memory component may be a single level cell flash memory, which means that the electrical level of each cell presents a bit. The second memory component is a multi-levels cell flash memory, which means a cell may store multiple-bits information. For example, a triple level cell flash memory may store three bits information in each cell. Under such configuration, along with the development of semiconductor processing continues minimizing size and providing high density, as well as cost down requirement, the stability for each cell brings more and more problems.

With the aforementioned concept, the same design of memory control circuit may be applied to flash memories of different reliability levels. For example, if under certain design in which the second memory component has lower reliability, the number of parity rows may be increased, the number of input data rows corresponding to each data group may be decreased or increasing the ratio of row parity codes to the whole data.

Conversely, if the second memory component has lower error rate, the number of input data rows included in each data group may be increased, or the ratio of parity rows and row parity codes to the whole data may be decreased.

In addition that the aforementioned configuration may be set during manufacturing, a dynamic detection mechanism maybe set in a control circuit. Specifically, if the reliability of the second component is deteriorating during usage, the ratio of the input rows in each data group may be dynamically adjusted. With such, although an electronic apparatus is used for a long time, the data reliability may not deteriorate rapidly.

It is to be noted that although the first memory component and the second memory component are circuits in a flash memory, persons of ordinary skilled in the art should be able to apply the same concept to storage devices external to the flash memory.

Another embodiment of the present invention includes a memory controller as mentioned above and an electronic apparatus equipped with the memory controller and the flash memory.

Besides, the embodiment of the present invention also includes a memory control method for reading data of flash memories. The memory control method includes reading the data group setting for obtaining data group setting for each block in flash memories.

After obtaining the data group setting of the flash memory, the data in the data group, taking each data group as a unit, are read one after another. After the data rows are read, the row parity code of the data row is used for error detection for the data rows. If the error may be corrected via row parity code, error correction is applied to the data row.

If data are still not able to be corrected with row parity code, two bits, for example, being maximum error capacity but the error containing more than three bits, the parity row of the data group is used next for performing error detection and correction. Conversely, if the row cannot be detected and corrected with parity row, data rows that cannot be corrected are recorded.

Besides, as mentioned above, each data group has multiple data rows. These data rows, as being ordered, construct an array with rows and columns. For data in each column, there is a parity row composed of corresponding parity data. If error detection and correction methods like LDPC or BCH are used for generating the parity row, the parity rows and the data in the data group may be calculated for obtaining syndrome corresponding to each column. In these methods, syndromes may indicate which data rows having errors.

If the data rows indicated having errors by the syndromes are consistent with the recorded rows that cannot be corrected, the errors indicated by the syndromes are trustable. In such case, the parity data of the parity rows are used for correcting the errors in the data rows.

By executing the method as described above, the errors may be corrected one after another. After errors are corrected, parity rows may be calculated again. If one data row has an error more than three bits and thus is not able to be corrected, after the original three-bits error has one bit corrected, which means the error is decreased down to two bits, the parity row now can be used for correcting the error.

Along with error bits are corrected one after another, abovementioned calculation of the syndromes can be calculated again. If necessary, multiple iterations may be executed for identifying errors one step after another. All errors are identified under certain limitations for ensuring data correctness and reliability.

Such feature is essential and very important for reserving user data. With such design, although a less expensive and less stable second memory component is used, the data loss risk for important user data is decreased.

More detailed description for embodiments and implementations are provided as follows accompanying associated drawings.

Please refer to FIG. 1, which illustrates a block in a memory component of NAND structure flash memory. Each data page has cells of M_0, M_1, M_2 to M_K. By applying certain voltage VG_0, VG_1, VG_2 to VG_N to each data page, the electrical level of the floating gate in each cell is read for obtaining data in each cell.

For single level cell (SLC) flash memory, each cell stores only one bit information, e.g. 0 or 1. In such case, when a proper setting voltage VG_0, VG_1, VG_2 to VG_N is applied to each data page, theoretically, the electronic volume stored in the cell is detected and corresponding data value are obtained.

On the other hand, for a multi-levels cell flash memory, multiple setting voltages need to be applied for each reading operation for determining the electronic volume in the cell to retrieve data values actually stored therein.

Figure 2:
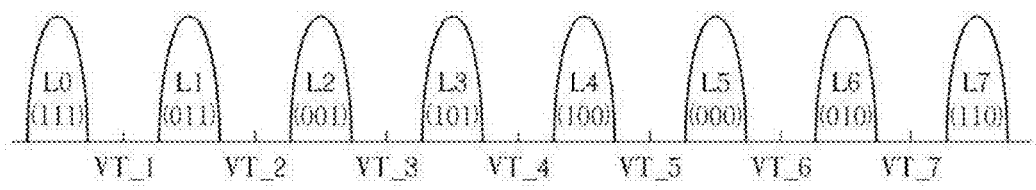
FIG. 2 illustrates relation between electronic volume and operating volume in a cell of triple levels cell (TLC) flash memory.

FIG. 2 illustrates a diagram showing relation between electronic volume and operating voltages in a triple levels cell flash memory. It can be found in this drawing that the stored electronic volume stored in a cell within ranges L0, L1, L2, ..., L7 correspond to stored bit information of 111, 011, 001, ... 110.

For such storage cells, when operating voltage of VT_1 is applied, the detection circuit is able to determine the electronic volume stored in a cell in either the L0 side, i.e. 111, or the L1, L2, L3, L4, L5, L6, L7 side, i.e. 111, 011, 001, 101, 100, 000 and 110.

By applying different multiple voltage combinations in specific order, the data of all three bits can be determined, i.e. the most significant bit (MSB), central significant bit (CSB) and least significant bit (LSB).

But, as described above, when the semiconductor process continues to develop toward high density and small size, stability of corresponding circuits and memory storage units have bigger problems under cost down design and with long time use.

Figure 3:
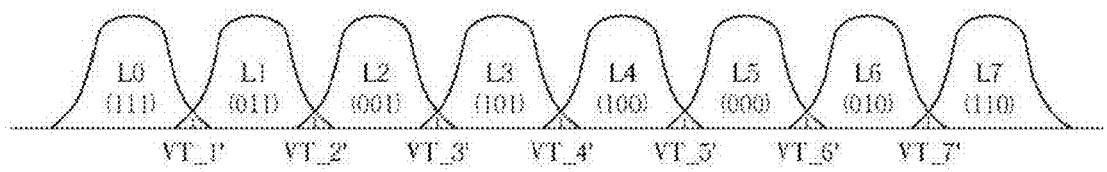
FIG. 3 illustrates possible cases when applying operating voltage VT_1 to the storage cells.

FIG. 3 illustrates a possible case, in which read data are incorrect due to partially overlapping among bit statuses or due to shifting of bit statuses when an operating voltage VT_1 is applied to a storage cell. In such case, various error parity methods, as well as dynamically adjusting operating voltage, are necessary for solve the problem of incorrectly determining bit information.

Figure 4:
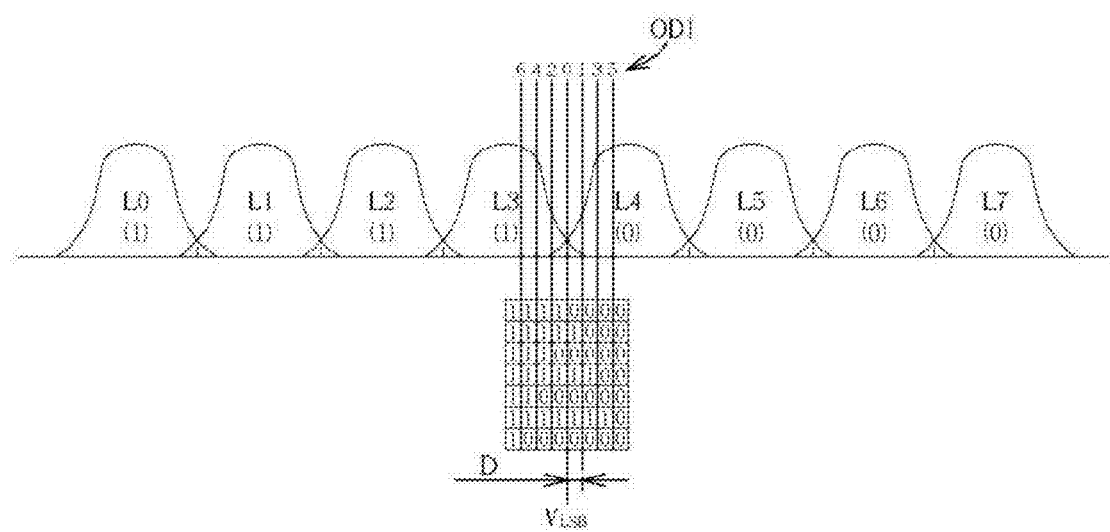
FIG. 4 illustrates using seven different voltages to perform read operation to a storage cell.

FIG. 4 illustrates applying 7 different voltages to a storage cell to perform read operation by detecting electronic volume to determine the LSB value stored in the storage cell as 0 or 1.

It is clear as illustrated in FIG. 4 that if the electronic volume distribution falls in the left sides of L0, L1, L2, L3 of VLSB, it means that LSB has the content of 0. On the other hand, if the electronic volume falls in the right sides L4, L5, L6 and L7 of VLSB, it means that LSB has the content of 1.

Because there is overlapping among statuses, different voltages are applied in a specific order. With such design, if the electronic volume falls between the VLSB+D and VLSB, the detected result will show certain information.

A bit result may be obtained each time when a voltage is applied. In other words, 7 bits may be obtained by applying 7 voltages. With the bit sequence corresponding to the 7 bits, accompanied with LDPC decoder circuits and algorithm, parity codes (or called parity codes) may be obtained for finding correct bit data. That is, using obtained soft information accompanied with LDPC, BCH or other methods to perform error verification and correction.

Figure 5:
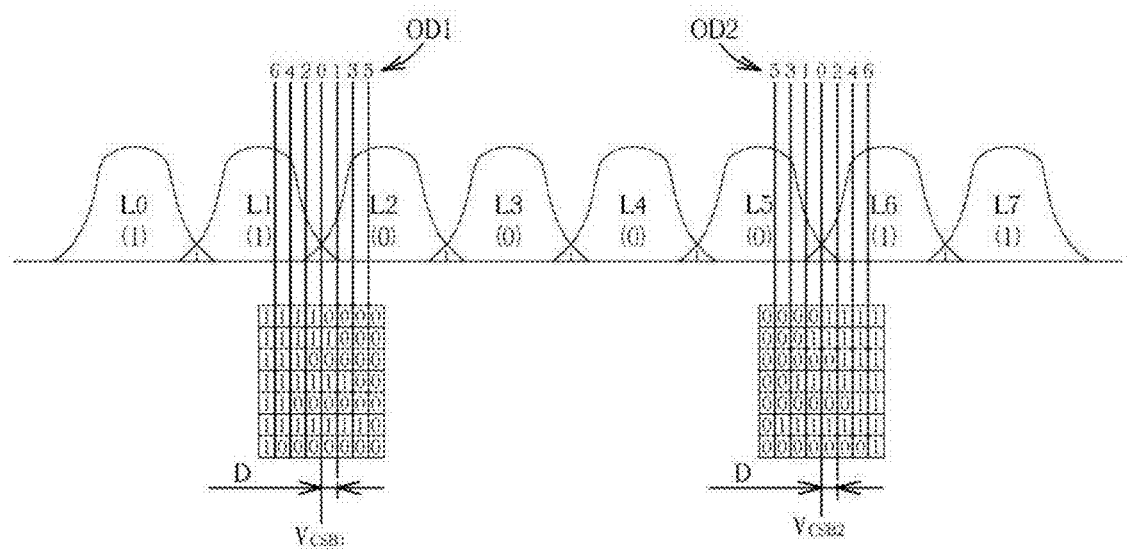
FIG. 5 illustrates how to find CSB.

FIG. 5 illustrates a method for finding CSB. Because CSB represents the second bit, it can be seen from FIG. 5 that if the electronic volume falls within L2, L3, L4 and L5, it means that the CSB of the storage cell is 0. On the other hand, if the electronic volume of the storage cell falls within L0, L1, L6 and L7, it means that the CSB of the storage cell is 1. Under such design, it can be understood that that two operating voltages VCSB1 and VCSB2 need to be applied to identify which section of the electronic volume falls within.

Similar to the above description, multiple step sizes for adjusting may be applied to VCSB1 and VCSB2 by using different voltages to perform read operations in a specific order. A bit sequence is obtained after each read operation. Accompanied with LDPC, BCH or other methods, error verification and correction may be performed.

Figure 6:
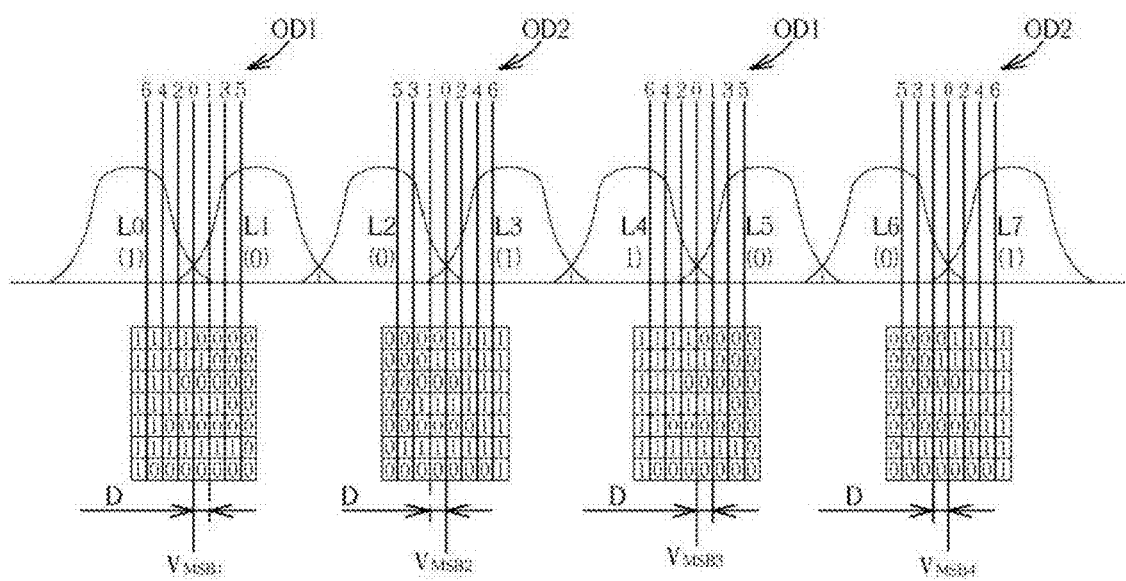
FIG. 6 illustrates how to find MSB.

Because MSB represents the most significant bit, it is illustrated in FIG. 6 that if the electronic volume falls in the sections of L0, L3, L4 and L7, it represents that the MSB bit of the storage cell is 1. On the other hand, if the electronic volume of the storage cell falls in the range of L1, L2, L5 and L6, it represents that MSB bit of the storage cell is 0.

Similarly, multiple step sizes may be applied to adjust VMSB1, VMSB2, VMSB3 and VMSB4 and corresponding different voltages are used for perform read operations. Each read operation generates a bit sequence and LDPC, BCH or related methods may be used for performing error verification and error correction.

Figure 7:
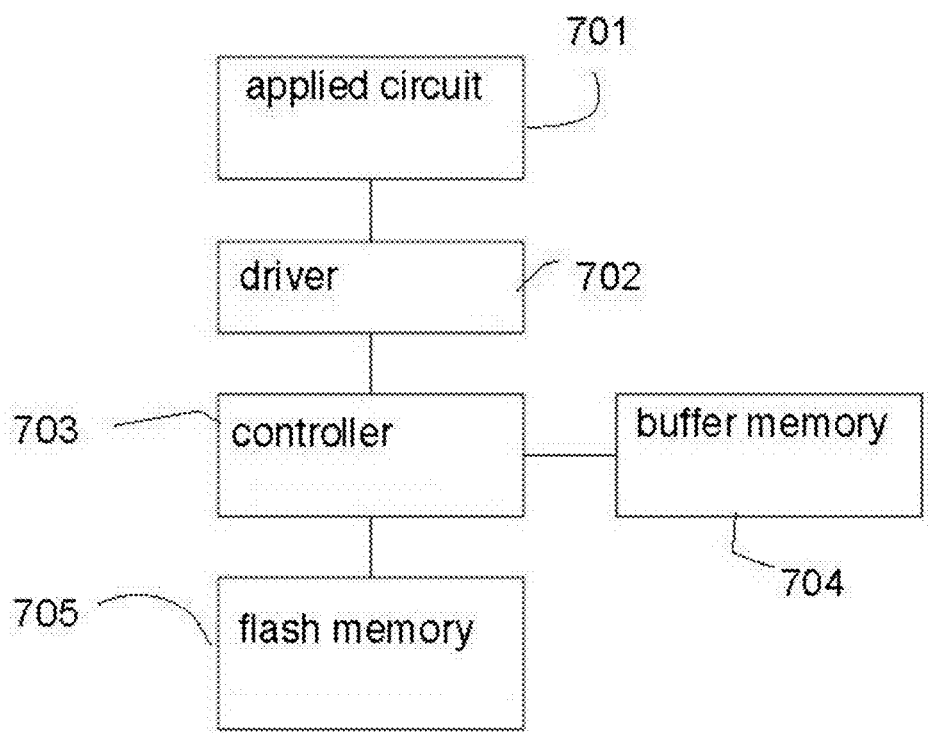
FIG. 7 illustrates an electronic apparatus using a flash memory.

FIG. 7 illustrates an example of an electronic apparatus using a flash memory. Such electronic apparatus may be implemented with various hardware and software designs, accompanied with additional sensors and input/output peripheral devices, to construct different electronic devices like laptop computers, cameras, camcorders, SSD hard disk, mobile phones, thumb drives, multimedia players, televisions, set top boxes, etc.

According to different design requirements, the applied circuit 701 may be composed of one or more customized circuit chips, or a general processor or a controller accompanied with associated firmware and software, and accompanied with an associated circuit board or other related components to achieve specific functions.

In this case, when the applied circuit 701 needs to access a flash memory 705, the controller 70 executes the instructions of the driver 702 to access the internal data of the flash memory 705. The flash memory 705 mentioned here may be one of aforementioned flash structures or other storage hardware. In one embodiment, the applied circuit 701 and the driver 702 are regarded as a host, but such configuration does not limit the scope of the present invention.

When data need to be written to the flash memory 705, the controller 703 handles coordination for communicating with the flash memory 705. Data are transmitted to the flash memory 705 under the data format and protocol of the flash memory 705. Usually, the controller 705 uses some buffer memory 704 for buffer or cache purpose. These buffer memories 704, under certain design, may be packaged with the controller 703 as one module or as two separate modules. For example, some flash memories 705 need certain data volume, e.g. a block or a data page, for each access. Therefore, data to be written to the flash memory 705 may be prepared and stored in the buffer memory 704. In addition, to prevent too frequently access the flash memory 705, different algorithms of caches may be applied for increasing the total access speed of data.

The applied circuit 70 may have different forms, e.g. circuit boards in a mobile phone or a camera, a camcorder, a processor, etc. The applied circuit 701 may also be a processor in a digital television or in a computer. The controller may be made as an independent integrated chip or be embedded in a processing circuit 701. Besides, associated control flow may be coded as instruction codes and executed by a general purpose controller to form a controller with associated functions. In some cases, the communication between the applied circuit 701 and the controller 703 may be encoded as instructions as a driver, and the applied circuit 701 executes the driver to perform the communication with the controller 703.

According to different design requirements, different adjustments may be applied. Specifically, some functions may be achieved by the controller 703, some functions may be achieved by the driver 702 and some functions may be achieved by the applied circuit 701. For example, the error management functions described below may be executed by the controller 703 in narrow sense or may be executed partially or totally by the driver 702 accompanied with the applied circuit 701. In such case, different components of the error management mechanism together form a controller in broad sense.

Figure 8:
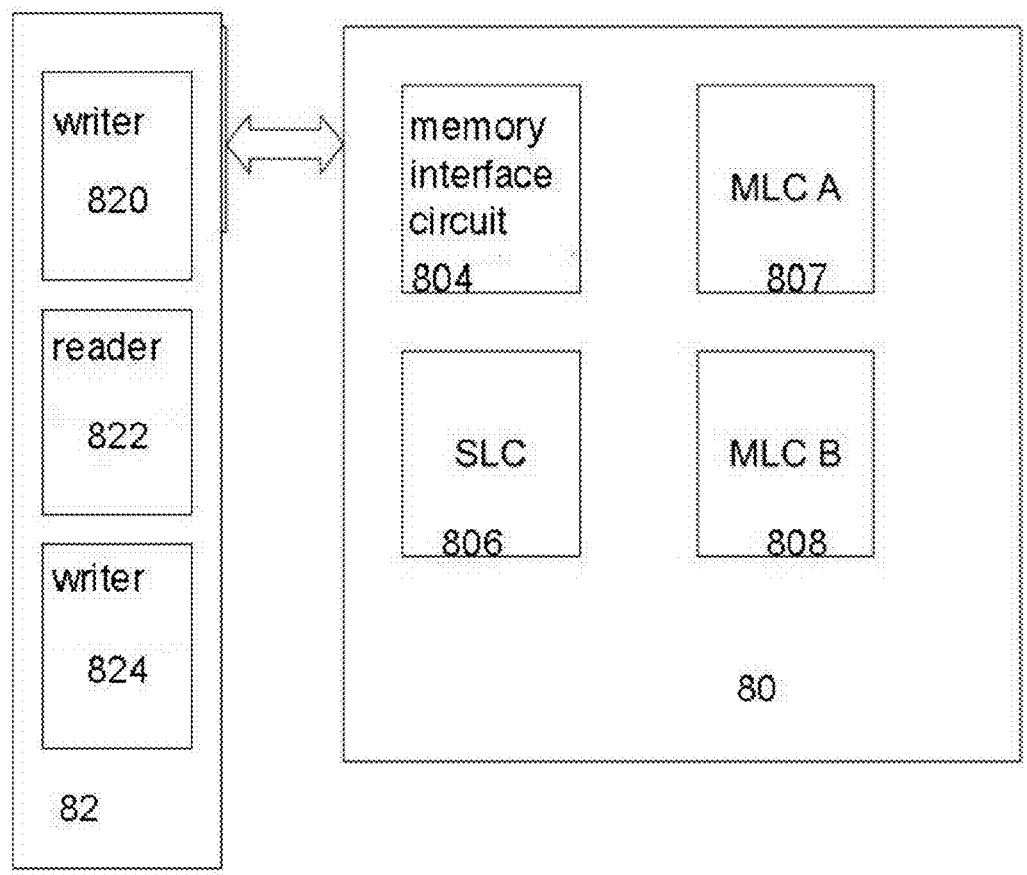
FIG. 8 illustrates a flash memory with hierarchical memory component structures.

FIG. 8 explains a flash memory architecture with hierarchy memory components. In this example, the flash memory 80 includes a memory interface circuit 804, a single level storage cell flash memory module SLC 806 and two multi-levels storage cell flash memory block MLC A 807 and MLC B 808. In real design, more multi-levels storage cell flash memories may be used.

The controller 82 includes a first memory component writer 820, a reader 824 and a second memory component writer 824. The controller 82 is used for controlling the flash memory 80. The controller 82 sends control instructions and data signals to the memory interface circuit 804 of the flash memory 80. Under different designs requirements, the memory interface circuit 804 of the flash memory 80 may only handle pure executions of instructions of the controller 82. Alternatively, the memory interface circuit 804 of the flash memory 80 may work together with the controller to handle the following processing work of data access and error management.

Single level storage cell flash memories and multi-levels storage cell flash memories respectively have different advantages and drawbacks. Generally, single level storage cell flash memories have simple structures, fast access speed and low error rate. On the other hand, multi-levels storage cell flash memories stores more than two bits information in each storage cell, thus having lower cost per unit than single level storage cell flash memories but at the same time having more complicated circuits.

In the structure of FIG. 8, single level storage cell flash memories may be a buffer for multi-levels storage cell flash memories. In other words, if data are to be written to the flash memory 80, the data may be written to a single level storage cell flash memory. For example, when a user is recording video or recording audio, due to timing requirement, data may be written to a single level storage cell flash memory.

Next, during idle period, the controller 82 may instruct the memory interface circuit of the flash memory 80 to write data of the single level storage cell flash memory to associated multi-levels storage cell flash memory synchronously or in pipelines.

In the example of FIG. 8, only one single level storage cell flash memory and only two multi-levels storage cell flash memories are illustrated. In real design, the number of single level storage cell flash memory and multi-levels storage cell flash memories may be adjusted. In addition, the single level storage cell flash memory may be used for long term storage, instead of only as a buffer, for different needs. The following error management mechanism may be adjusted according to different design requirements or use status for the flash memory 80. For example, when the data storage are near full, the single level storage cell flash memory may be used for storing data by dynamically turning on, turning off, or adjusting the following error adjustment mechanism.

Moreover, the single level storage cell flash memory may be replaced with multi-levels storage cell flash memories with better quality or fast access speed. For example, volatile memories, like RAM memory, may be used. If there is backup power source, even the main power is break or the main battery is running out of power, the backup power source may still keep data of the RAM memory for a certain period of time. In such period of time, the controller or the memory interface circuit may store the data to nonvolatile memories. Alternatively, the MLC in FIG. 8 may be replaced with TLC, which stores three or more bits information in one cell, or the SLC in FIG. 8 is replaced with a MLC. Such changes may also be accompanied with the following error management mechanism.

Figure 9:
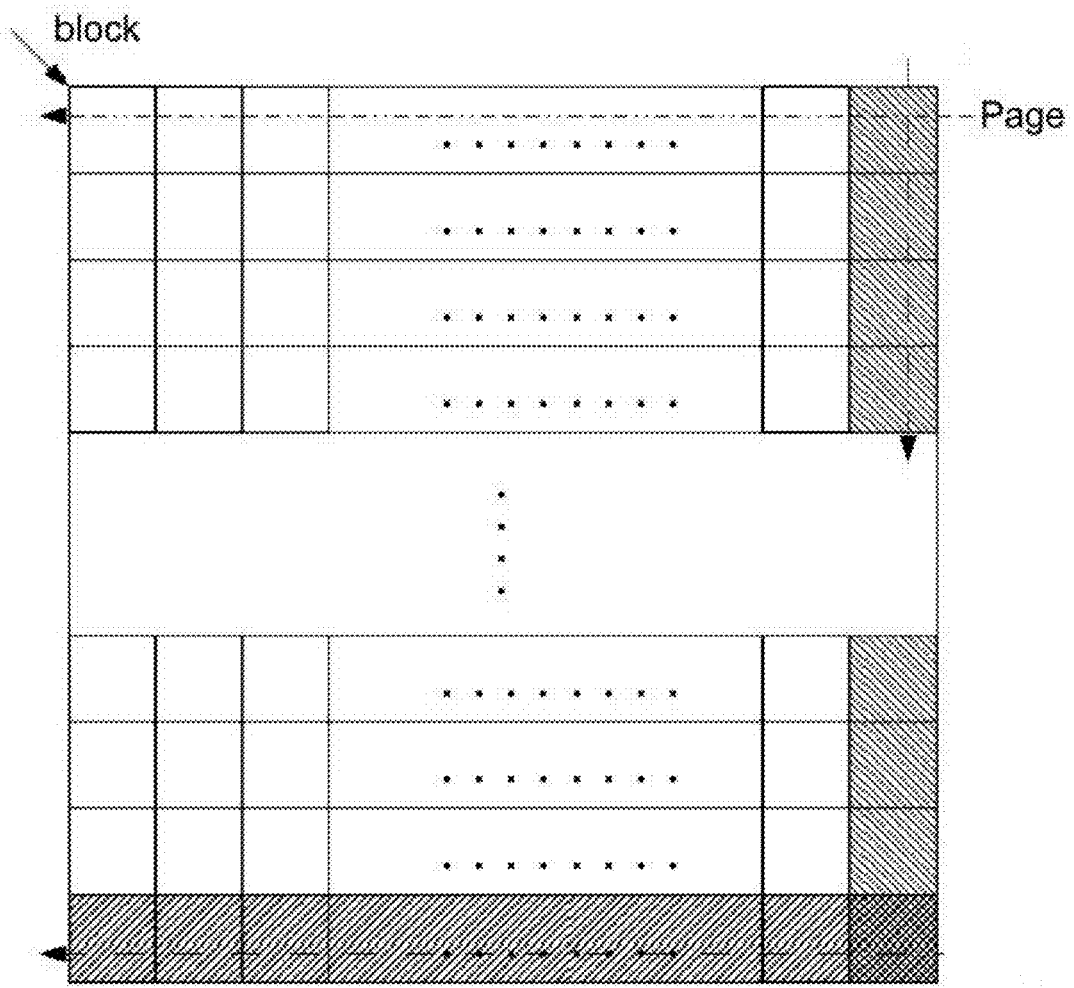
FIG. 9 illustrates data storage format in a multi-levels storage cell flash memory.

FIG. 9 explains the data format in a multi-levels storage cell flash memory. As mentioned above, the flash memories are grouped for performing read, write or erase operations. FIG. 9 illustrates an example of how data are arranged in a multi-levels storage cell flash memory.

In the data arrangement, the whole array form a block. In this block, each row forms a data page. Each square in each row represents a storage cell for storing a bit or a byte. The data page may be regarded as a logical data page or a physical data page. Persons of ordinary skilled in this art may design under their requirements. Usually, standards like JDEC require the block size and the data page size to be fixed so that products made by different manufacturers may be compatible in certain level to enhance development of the industry. Nevertheless, the following methods may also be applied even the block size and the data page size are fixed. Besides, the invention may also be applied to special block size and data page size.

Moreover, as mentioned above, for performing error detection and error correction, error handling encoding methods like LDPC, BCH or Reed Soloman may be applied. Such algorithms may be used for calculating the data to be stored to generate parity data (or called parity data) and these data are together stored in the MLC memory component illustrated in FIG. 8.

In the example of FIG. 9, the parity data (marked as skewed lines squares) are stored in end of each row for each data page. Although it is marked as one square for parity data, the actual units reserving for storing parity data, as well as how error tolerance and algorithms chosen, may be adjusted under needs. Persons of ordinary skilled in the art would know how to implement their designs by applying conventional algorithms to the present invention.

In addition to the encoding for error detection or error correction for data of each row, data for each column may also be encoded for error detection or error correction. In the example of FIG. 9, one or more parity rows obtained from error correction encoding are stored in the bottom of this block. In one embodiment, one parity row may be stored in the last page for a block, but such configuration should not be regarded as limitation to the scope of the present invention. Meanwhile, the space reserved for storing parity data (parity row) may be adjusted according to error correction algorithms and error tolerance ratio.

In this example, one same algorithm may be used for generating the parity row and the parity codes, but in another case, different algorithms may be used, too. The parity row corresponding to status of memory cells in vertical direction, which may share one common signal line. Therefore, memory cells in vertical direction may have different characteristic with memory cells in horizontal direction. In such case, different algorithms may be applied for more effectively achieve error management work.

In addition, it is illustrated that there is an overlapped section for the parity row and row parity codes. Another different algorithm or just the same algorithm as the algorithm to generate parity rows and row parity codes may be applied. In some algorithms, no matter the row parity codes is calculated before the parity row or vice versa, the parity data in the overlapped section are the same.

Figure 10:
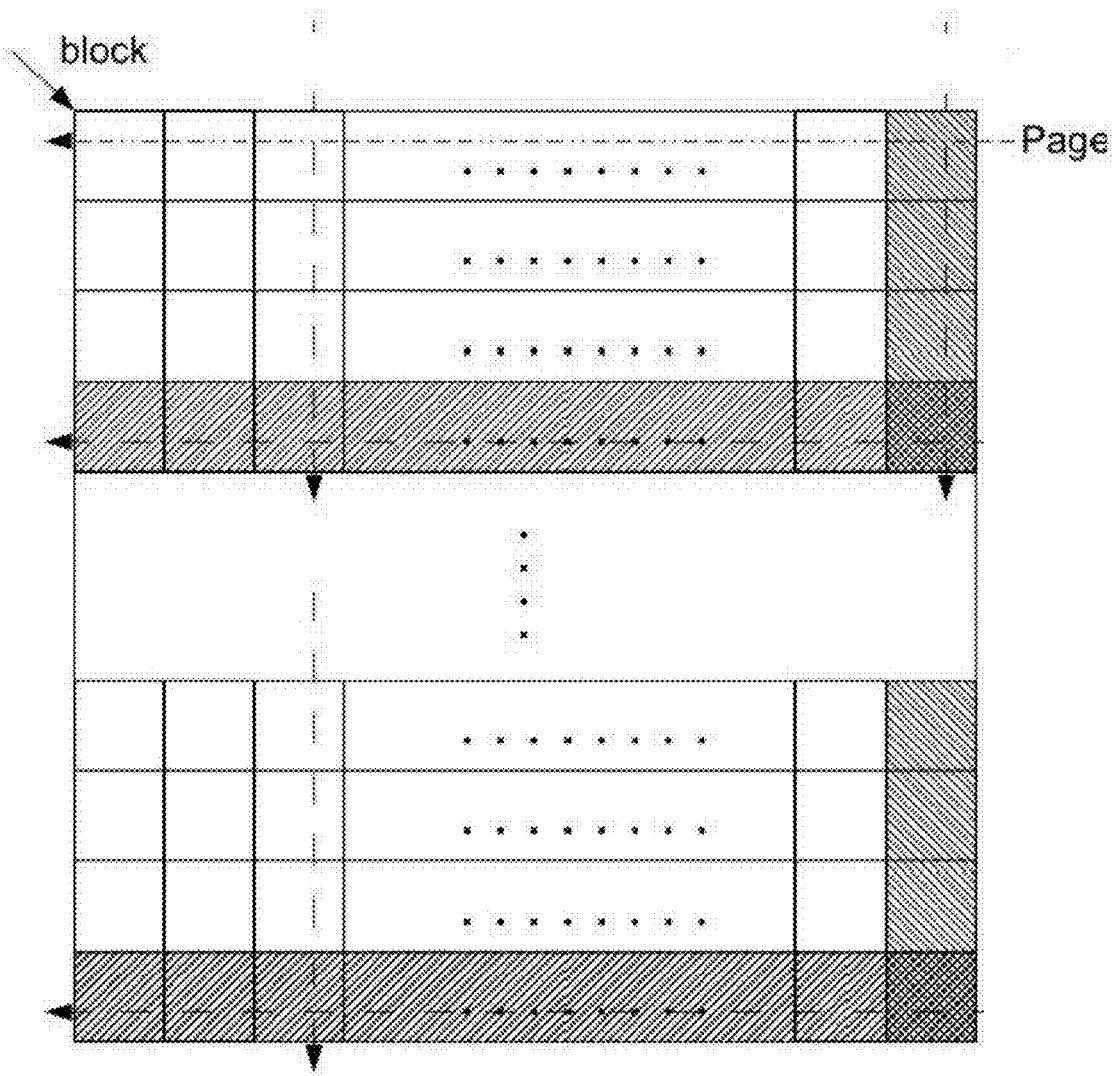
FIG. 10 illustrates a second method for associating data and parity data.
Figure 11:
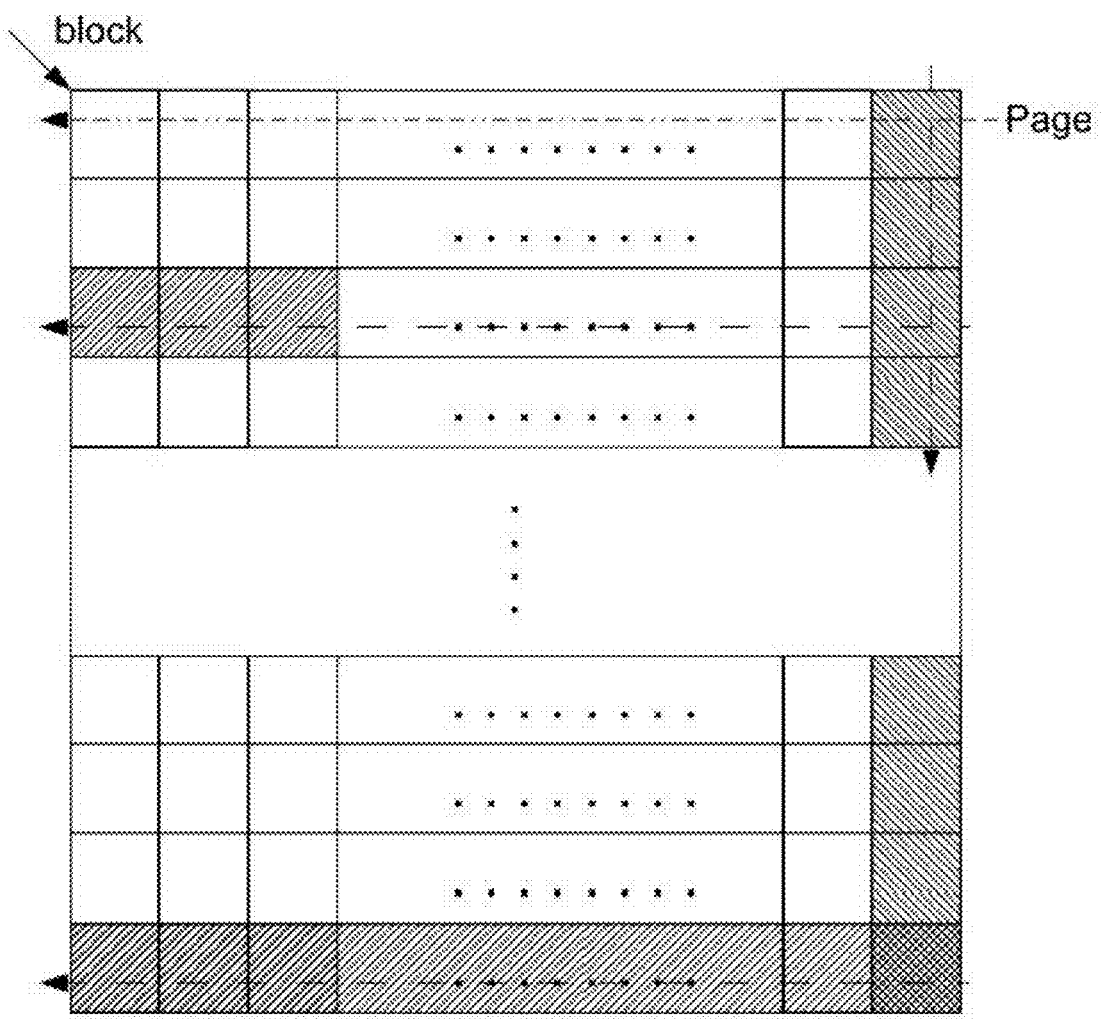
FIG. 11 illustrates a third method for associating data and parity data.

In FIG. 9, all data pages in the same block are calculated to obtain associated parity data (parity rows), but this is not a necessary limitation. FIG. 10 and FIG. 11 illustrate different relations between different data and parity data. All these methods may be applied in this embodiment.

FIG. 10 illustrates a second method for associating data and parity data. In the example of FIG. 10, each three rows (data pages) are associated with a corresponding row (data page) for storing parity data (parity row) and together form a data group. In other words, under such arrangement, one block may have several data groups. As mentioned above, the arrangement of three data rows associated with one parity row may be changed to, for example, 50 data rows associated with 3 parity rows or any other configurations.

Similarly, in horizontal direction, the association relation between data and parity codes may be adjusted dynamically. The number of row parity codes and location for storing the row parity codes, or whether the row parity codes and data are stored in interleaved manner, or whether row parity codes are stored in the front or end of a row may be adjusted or set under design requirements.

FIG. 11 illustrates a third method for associating data and parity codes. FIG. 11 illustrates another approach. In FIG. 11, the ratio between the data the parity data is not fixed but is able to be adjusted dynamically when needed. For example, after the type of flash memories are known, the controller may use drivers or set registers to determine error management algorithms, ratio between data and parity codes and locations for storing data and parity codes.

In fact, actual error conditions may be calculated after a product is produced and even after being used for dynamically adjusting or selecting different algorithms, setting ration between data and parity codes or their stored locations. All these variations are covered by the same invention spirit.

Figure 12:
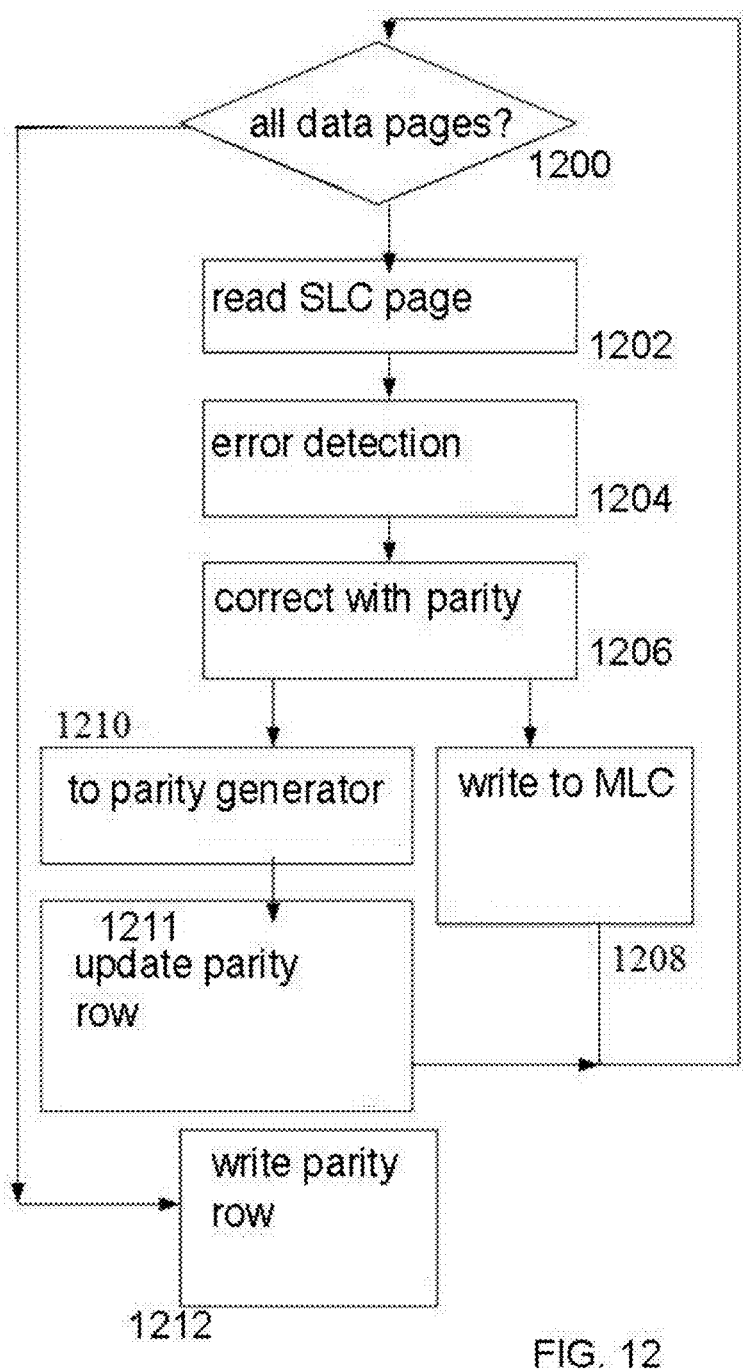
FIG. 12 is a flowchart.

The flow chart of FIG. 12, accompanied with the diagrams of FIGS. 13, 14, 15 and 16 illustrates how data are read from SLC and written to MLC in FIG. 8.

Figure 13:
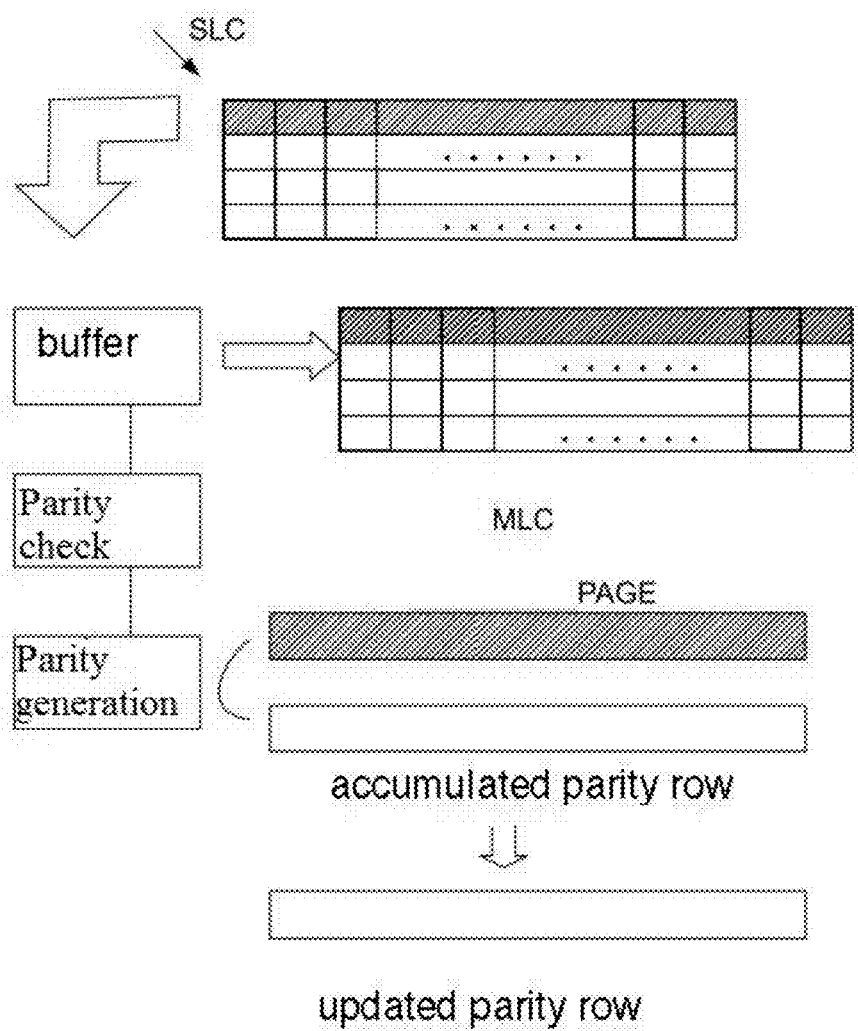
FIG. 13 to FIG. 16 illustrates an embodiment.

In this example, the second memory component writer 824 of the controller divides the block of MLC into groups. In the example of FIG. 13, for explanation clarity, three data rows (data pages) are associated with one parity row (data page), and they together form a data group. Under real design, the ratio between data rows and parity rows may be smaller. For example, a block with 100 data pages may be divided into five groups. Each group has 19 data rows associated with one parity row.

Next, please refer to FIG. 12 and FIG. 13 to FIG. 16, which explain how this example is operated.

First, the controller reads a data page and puts the data page in the buffer (step 1202). Because the data page may have an error by itself, if the controller detects an error (step 1204), the parity codes in the data read from SLC are used for correcting the data (step 1206). Corrected data or correct data are then transmitted to the memory interface circuit of the flash memory and the data of the data page are written to corresponding data page in the MLC (step 1208).

Besides, the data checked are also transmitted to error correction code generation unit (step 1210) for generating parity codes (step 1211). To generate such data, in this example, the data row checked this time is accumulated and calculated with previous parity row data to update the parity row.

Figure 14:
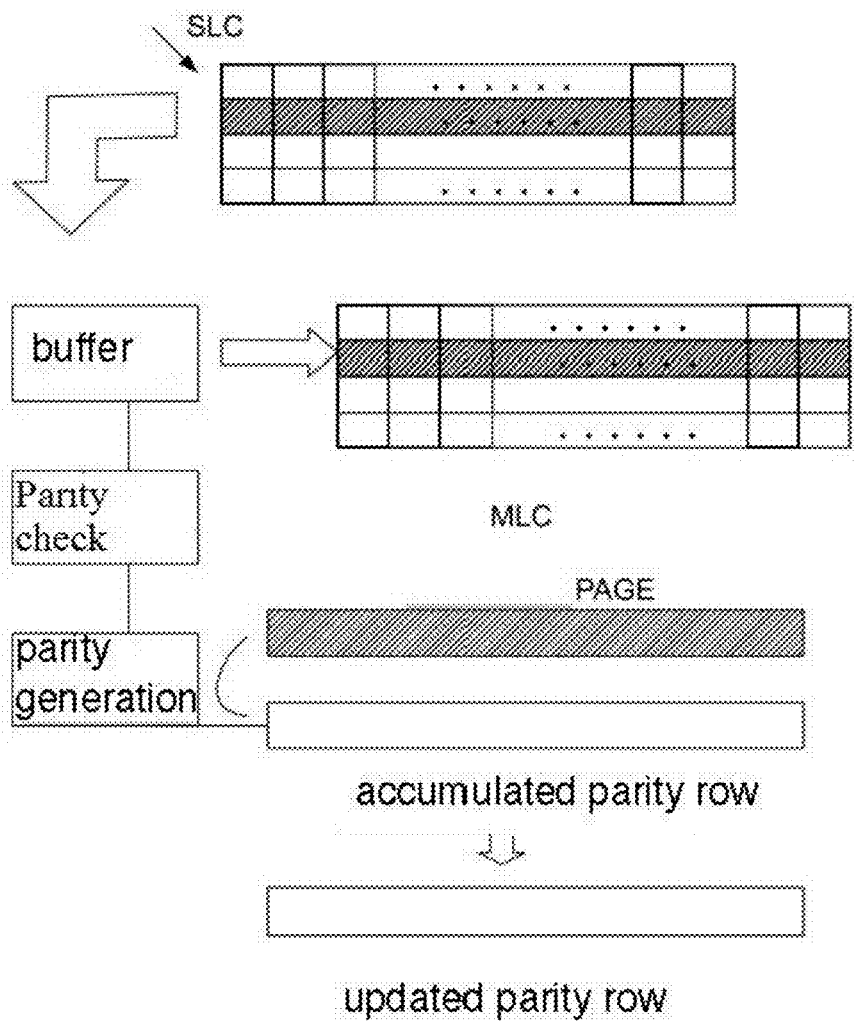
Figure 15:
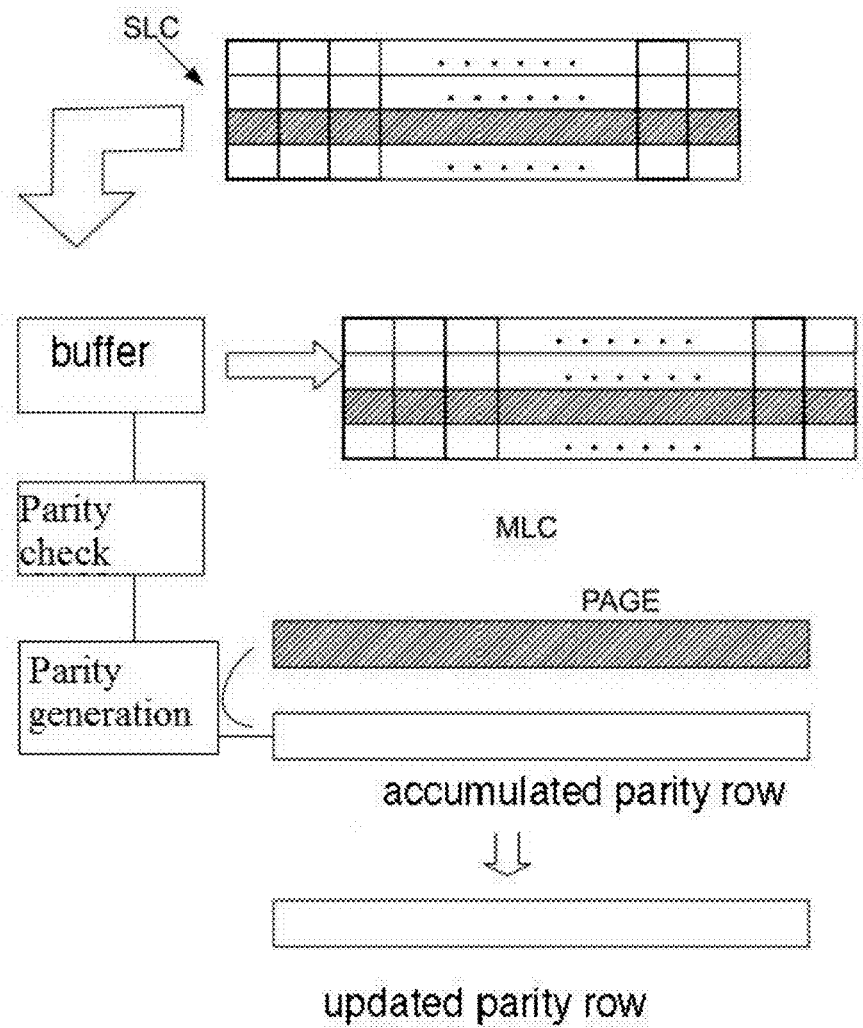

For example, the parity row in FIG. 14 is generated using the parity row calculated in FIG. 13 and the second row data in FIG. 14 to apply methods like LDPC or BCH. The parity row in FIG. 15 is updated by the updated parity row and the third data row read in FIG. 15.

Figure 16:
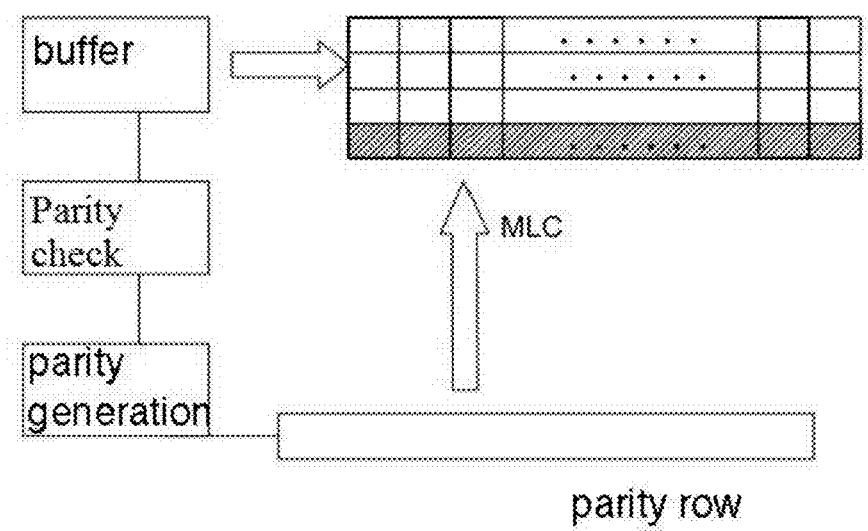

After the data rows for this group are all processed, i.e. the associated parity row being obtained completely, the parity row is written to corresponding location in the MLC (step 1212, as illustrated in FIG. 16.

Under such design, even there is power break occurred during operation, e.g. a user unplugging power or removing a memory card from a computer at random or removing a battery from a mobile phone, it is not the whole block data being affected, but only an affected data group need to be re-written to the MLC.

Next, please refer to FIG. 17 to FIG. 20, which illustrates another embodiment of the present invention.

Figure 17:
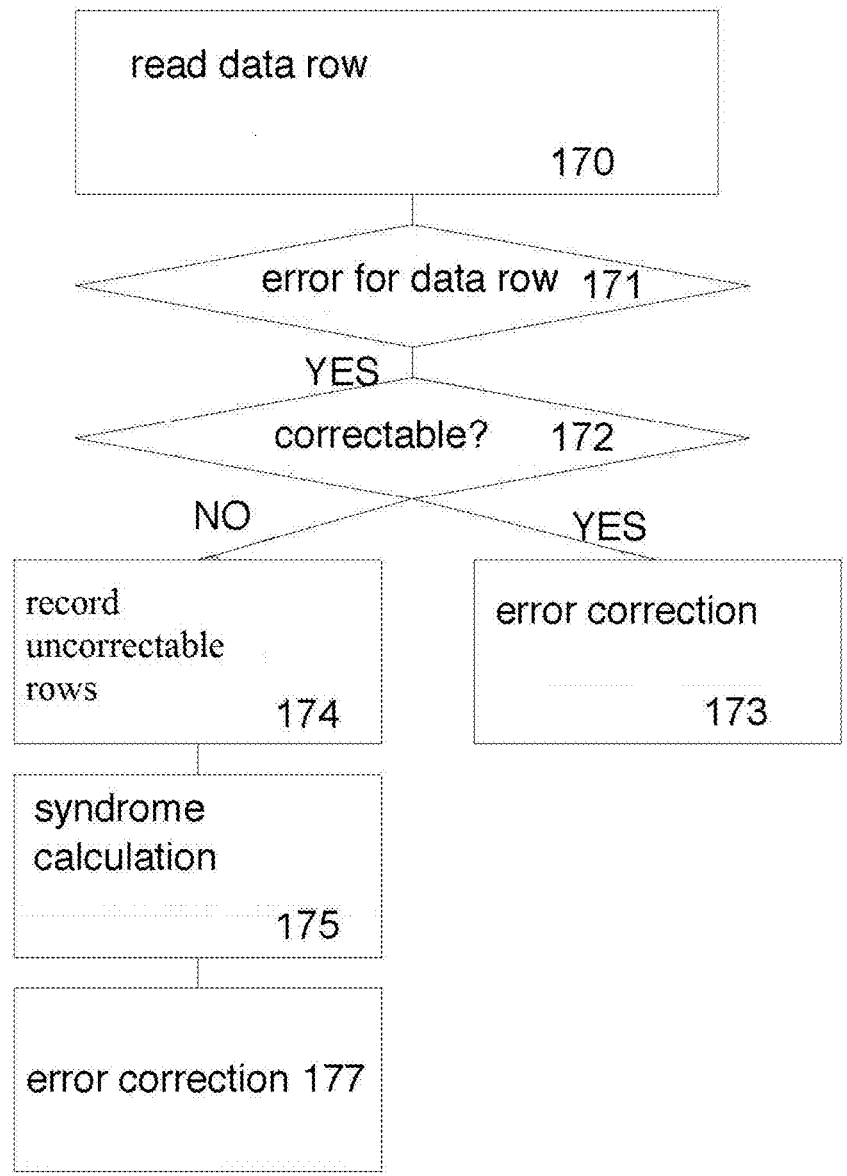
FIG. 17 illustrates a flowchart of a memory control method.

FIG. 17 illustrates a flowchart for a memory control method. The memory control method is used for controlling a flash memory to access internal data in the flash memory.

The flash memory has a memory component, e.g. a multi-levels storage cell flash memory (MLC) and the memory component has a plurality of blocks. Each block ahs multiple data pages and the memory control method includes the following steps.

First, the data group setting is read to know the association relation between blocks and data pages in the memory component. For example, such information may include how many data rows and parity rows are included in a data group, and which data pages in a block are used for storing data rows and parity rows. Next, a data row is read from the data group (step 170). The row parity codes of the data row are used for detecting whether there is an error occurred (step 171). If there is an error occurred and the error may be corrected (step 172), the error is corrected (step 173).

If the error cannot be corrected directly using the parity codes, e.g. an error of more than three bits occurred while error tolerance being under three bits, the status that errors cannot be corrected is recorded, e.g. addresses of the data row being recorded in a error correction table (step 174).

Next, other data rows and parity rows of the data group are read. Using parity methods associated with the parity row like LDPC or BCH, associated syndromes for each column in the data group are calculated (step 175). In other words, when the data rows in the data group are arranged as an array, the combination of corresponding data across data rows.

Figure 18:
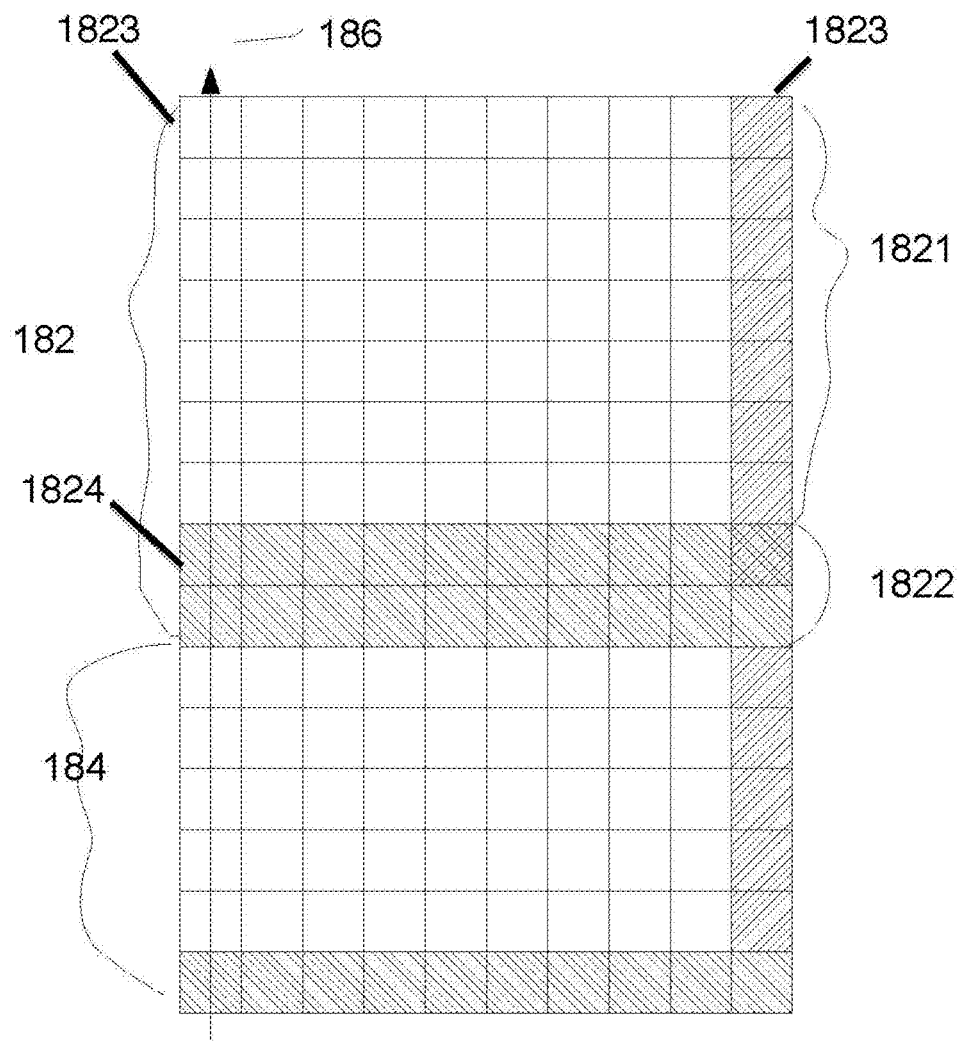
FIG. 18 illustrates a logical arrangement of a block in a flash memory module.
Figure 19:
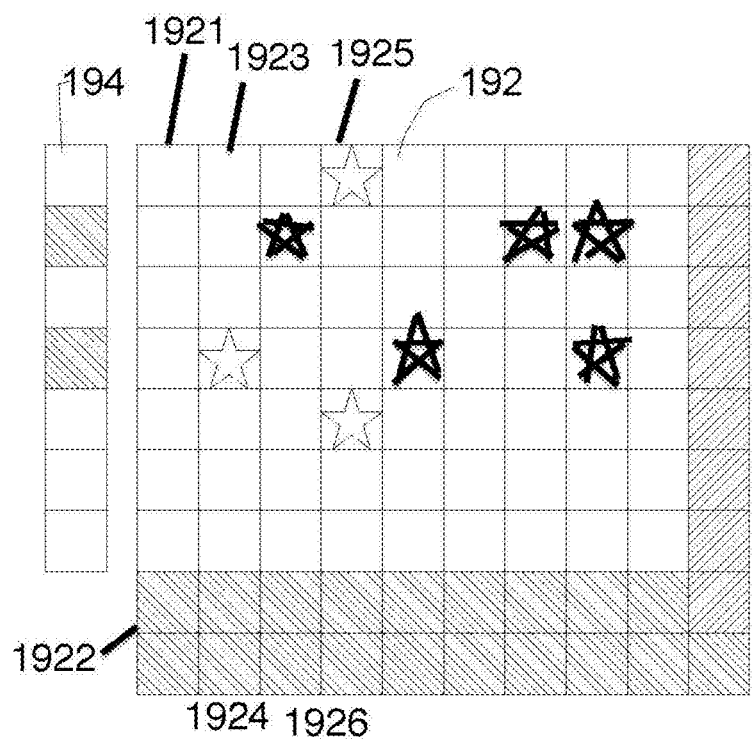
FIG. 19 to FIG. 20 illustrate error correction for a flash memory.

In the example of FIG. 18, which illustrates a logical configuration diagram of a memory component like a flash memory module. In this group, there are two data groups 182 and 184. The first data group 182 is composed of 7 data rows and two parity rows 1822. In addition to the parity rows, each data row in data rows 1821 has its own row parity codes. These data rows are logically arranged in arrays as illustrated. One row refers to logical data units formed by data cells in horizontal direction. One column refers to logical data units formed by data cells in vertical direction. For example, the reference mark 186 represents the first column data of the block.

For parity methods like LDPC and BCH, when syndromes are calculated according to parity row and data of data groups, the rows that have errors may be identified and corresponding correction may be applied. For example, the first column 1823 of the first data group and the parity row 1824 of the first column may be calculated, e.g. to calculate syndrome, to detect whether there is an error in the first column and to determine whether such error is correctable (step 176). For example, if the parity row corresponding to the first column only tolerate errors under three bits and only two bits error is occurred in the first column, the error can be corrected. If the error can be corrected, correction processing is performed (step 178). On the other hand, if the error is not correctable, correction is not performed.

For example, the data group 192 has seven data rows and two parity rows (marked with shadow lines). First, each data row is verified by its associated row parity codes. If an error is found, an associated correction is performed. In the error is found but is not correctable, it is recorded in the table 194 (the data row marked with shadow lines). In this example, each row parity codes at most support correcting two errors, and each parity row supports correcting one error. The table 194 indicates that the second row and the fourth row having errors, and the errors cannot be corrected directly with their row parity codes (for more than two errors occurred).

Next, the parity row is used for correction one column after another. First, the first column 1921 of the data group and its associated parity row 1922 are performed with error parity for the first column 1921 and no error is detected for this column. Next, the second column 1923 of the data group 192 and its associated parity row 1924 are performed with error parity and an error (marked with a star) is found in the column. In this example, each parity row supports correcting one error and therefore the error is corrected. With the same approach, the fourth column 1925 of the data group 192 and its associated parity row 1926 are performed error parity and two errors (marked as starts) are found. In this example, each parity row supports correcting two errors, and therefore the error cannot be corrected.

Figure 20:
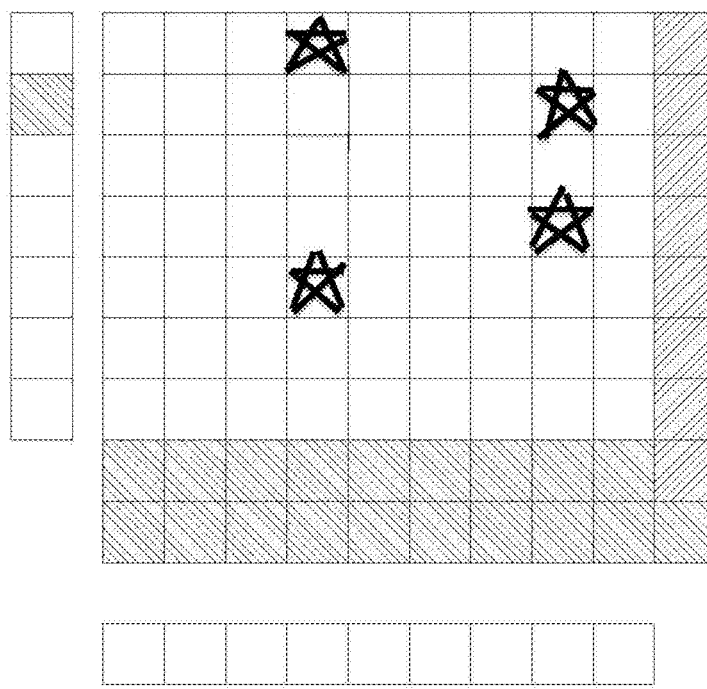

With such logic, after using the parity rows for performing error parity for the data group 192 column by column, column with only one error is corrected. The error type of the data group is illustrated in FIG. 20, in which the data units marked with stars are data units that have errors. It is shown in FIG. 20 that in each data row in the data group 192, none has data units with more than two errors. Therefore, corresponding row parity codes are used again for correcting the second row and the fourth row to get corrected second row and the fourth row.

In short, original uncorrectable errors with row parity codes because of too many errors can now be corrected after parity rows are used for error correction because errors are decreased. As illustrated in FIG. 20, the number of errors marked as stars are decreased. Once some errors are corrected, the syndromes may further indicate more information to correct more errors.

After such operation with multiple iterations, although maybe not all errors may be corrected, there are higher chance for correcting more errors with such method.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory control method for controlling a flash memory, the flash memory comprising a first memory component and a second memory component, the second memory component comprising a plurality of blocks, each block comprising a plurality of data pages, the memory control method comprising:
   writing original data to the first memory component;
   reading from the first memory component to obtain input data, the input data comprising a plurality of input data rows;
   dividing the plurality of input data rows into a plurality of data groups;
   writing each of the input data row corresponding to each of the data groups into one of the data pages in the second memory component;
   writing a parity row corresponding to each of the data groups to one corresponding data page that is distinct from a data page storing the written input data row in the second memory component, wherein a number of the input data rows corresponding to each of the data groups is smaller than a number of the data pages for each of the blocks; and
   updating the parity row of corresponding data group according to accumulated calculation of content of the input data row each time before writing an input data row to the second memory component.

2. The memory control method of claim 1, wherein when the plurality of input data rows are divided into the plurality of data groups, a number of input data corresponding to each of the data groups is determined by reference to an error occurrence rate of the second memory component.

3. The memory control method of claim 2, wherein when the error occurrence rate of the second memory component is higher, the number of the input data rows corresponding to each of the data groups is smaller.

4. The memory control method of claim 1, wherein the numbers of the input data rows corresponding to at least two data groups are different, the at least two data groups corresponding to two different blocks of different second memory components.

5. The memory control method of claim 1, wherein the numbers of the input rows corresponding to at least two of the data groups are different.

6. The memory control method of claim 1, further comprising a setting mechanism for setting the number of the input data rows corresponding to each of the data groups.

7. The memory control method of claim 1, further comprising detecting an error occurrence rate of the second memory component during operation, and adjusting the number of the input data rows for each of the data groups.

8. The memory control method of claim 6, further comprising calculating a parity row corresponding to an input row, and writing both the parity row and said input row to the second memory component.

9. The memory control method of claim 1, further comprising performing error correction to obtain the input data rows when reading the original data from the first memory component.

10. The memory control method of claim 1, wherein the first memory component has lower error occurrence than second memory component.

11. The memory control method of claim 1, wherein the first memory component is a single level cell flash memory, and the second memory component is a multi-levels cell flash memory.

12. A memory controller for controlling a flash memory, the flash memory comprising a first memory component and a second memory component, the second memory component comprising a plurality of blocks, each block comprising a plurality of data pages, the memory controller comprising:
- a first memory component writer for writing original data to the first memory component;
- a reader for reading the original data from the first memory component and generating an input data, the input data comprising a plurality of input data rows;
- a second memory component writer for dividing the plurality of input data rows into a plurality of data groups, writing the input data rows corresponding to each data group being associated with corresponding data pages of the second memory component, and writing a parity row corresponding to each data group into corresponding data pages that are distinct from data pages storing the written input data rows, wherein a number of the input data rows of each of the data groups is smaller than a number of the data pages of each of the blocks in the second memory component; and
- a parity row generator, each time before writing one of the input data rows to the second memory component, the parity row generator using content of an input data row to update associated parity row of the data group corresponding to the input data row.

13. The memory controller of claim 12, further comprising a setting device, for setting the number of the input data rows for each of the data groups.

14. The memory controller of claim 12, wherein the second memory component writer further comprising dynamically adjusting the number of the input data rows for each of the data groups according to detection of an error occurrence rate during operation of the second memory component.

15. A memory control method for controlling a flash memory, the flash memory comprising a first memory component and a second memory component, the second memory component comprising a plurality of blocks, each block comprising a plurality of data pages, the memory control method comprising:
- writing original data to the first memory component;
- reading from the first memory component to obtain input data, the input data comprising a plurality of input data rows;
- dividing the plurality of input data rows into a plurality of data groups;
- writing each of the input data row corresponding to each of the data groups into one of the data pages in the second memory component; and
- writing a parity row corresponding to each of the data groups to one corresponding data page that is distinct from a data page storing the written input data row in the second memory component, wherein a number of the input data rows corresponding to each of the data groups is smaller than a number of the data pages for each of the blocks;
- wherein the numbers of the input data rows corresponding to at least two data groups are different, the at least two data groups corresponding to two different blocks of different second memory components.

* * * * *